United States Patent [19]

Hickox et al.

[11] 4,154,873
[45] May 15, 1979

[54] METHOD OF INCREASING FIELD INVERSION THRESHOLD VOLTAGE AND REDUCING LEAKAGE CURRENT AND ELECTRICAL NOISE IN SEMICONDUCTOR DEVICES

[75] Inventors: Robert E. Hickox; Heber J. Bresee, both of Tucson, Ariz.

[73] Assignee: Burr-Brown Research Corporation, Tucson, Ariz.

[21] Appl. No.: 850,345

[22] Filed: Nov. 10, 1977

[51] Int. Cl.² .......................................... H01L 21/477
[52] U.S. Cl. ........................................ 427/82; 427/93; 427/372 A; 427/344; 427/374 R; 427/377; 427/379; 427/398 C
[58] Field of Search ..................... 427/82, 93, 226, 299, 427/314, 372 A, 374 R, 344, 377, 379, 398 C, 399, 444

[56] References Cited

U.S. PATENT DOCUMENTS

| 3,666,546 | 5/1972 | Reuter et al. | 427/93 |
| 3,903,325 | 9/1975 | Horiuchi | 427/399 |
| 4,016,007 | 4/1977 | Wada et al. | 427/93 |

Primary Examiner—John D. Smith
Attorney, Agent, or Firm—Cahill, Sutton & Thomas

[57] ABSTRACT

A method for processing a semiconductor wafer to reduce electrical noise, to reduce the surface component of junction leakage current, to increase junction reverse breakdown voltage, and to increase field inversion voltage. Subsequent to last high temperature processing to which the semiconductor wafer is exposed in course of its manufacture, the semiconductor wafer is subjected to an annealing cycle in an inert ambient at a temperature in the range of 600 to 950 degrees Centigrade. At this point the semiconductor wafer has a field oxide thereon produced by prior processing operations. The annealing cycle stabilizes the semiconductor device by allowing an oxide-semiconductor interface region of the wafer to attain a minimum energy configuration, thereby reducing the surface-state charge density. The semiconductor wafer is then exposed to an oxidizing ambient for a short time to increase the oxide charge. At the end of the oxidizing procedure, the wafer is quenched to prevent reduction of the oxide charge by diffusion of the oxidizing species which create the oxide charge. The increased oxide charge increases the field inversion voltage. The semiconductor wafer is thus again subjected to an inert ambient, for restabilization. The semiconductor wafer is then subjected to a low temperature annealing cycle in a hydrogen ambient at a temperature in the range from 300 to 500 degrees Centigrade. The low temperature annealing step reduces the surface-state charge density without substantially decreasing the density of the oxide charge trapped in the field oxide, and therefore does not substantially lower the field inversion voltage.

17 Claims, 4 Drawing Figures

METHOD OF INCREASING FIELD INVERSION THRESHOLD VOLTAGE AND REDUCING LEAKAGE CURRENT AND ELECTRICAL NOISE IN SEMICONDUCTOR DEVICES

BACKGROUND OF THE INVENTION

1. Field of the Invention

The invention relates to a method of making semiconductor devices with high field inversion voltage as well as low PN junction leakage current, and low 1/f noise.

2. Description of the Prior Art

It is known that ionic charges at the semiconductor surface or in an oxide on the semiconductor surface may induce image charges in the semiconductor. The ionic charges may include the surface-state charge $Q_{SS}$ and the oxide charge, often designated by $\rho_x$, which is discussed hereinafter. The image charges are often called "channels". Such ionic charges may also increase the extent of the depletion regions of PN junctions which terminate at the silicon surface near the ionic charge. The enlarged depletion regions enclose more trapping sites and recombination centers, thereby increasing the surface component of the PN junction reverse leakage currents. The exploration of this phenomenon can be found in many textbooks on semiconductor physics.

The above-mentioned 1/f noise or flicker noise in semiconductor devices "flicker noise" may be a serious problem at low frequencies. It is caused by carrier density fluctuations caused by certain modulation mechanisms, such as the surface field effect in MOS devices. The flicker noise or 1/f noise is believed to be due to the random fluctuation of density of the carriers at the location of the surface states, and is a dominant noise at very low frequencies. Regeneration-recombination noise in an IGFET is believed to be due to random fluctuation of the charge carriers at the recombination centers and trapping sites in the depletion regions of the semiconductor device. It has been shown that the 1/f type noise due to surface states may be reduced by decreasing $Q_{SS}$. It is further known that the surface state charge affects the "field inversion voltage" at which the above-mentioned channels may be formed. Such channels may cause parasitic leakage currents which are harmful to circuit operation. Such parasitic leakage currents occur when the semiconductor surface is inverted to form a parasitic channel between two doped regions in the semiconductor device. Such channels may be induced by a charged conductor which crosses over a passivating oxide between the two doped regions. Such oxide is referred to as a "field oxide". The two doped regions, the field oxide, and the overlying conductor form a parasitic MOS device, whose threshold voltage is called the "field inversion voltage", designated $V_{FI}$. The field inversion voltage is proportional to both $Q_{SS}$ and the oxide charge $\rho_x$. Both $Q_{SS}$ and $\rho_x$ are very dependent on oxidizing procedures, temperature cycling, and annealing operations used in the manufacture of semiconductor devices.

For detailed discussion of surface effects on PN junctions and MOS devices, see "Physics and Technology of Semiconductor Devices" by A. S. Grove, John Wiley and Sons, Inc., New York, 1967 and, "Physics of Semiconductor Devices" by S. N. Sze, John Wiley and Sons, Inc., New York, 1969.

It is well known that surface states produced during oxidation may be virtually eliminated by various annealing processes, such as annealing of the silicon wafer in a helium ambient at temperatures greater than 800° C. Such annealing processes are believed to cause completion of dangling or unsaturated silicon-oxygen bonds and elimination of the corresponding surface states. Various ambient gases present during the heat treatment may act as catalysts to the physical processes in which the dangling bonds are completed. For more detailed discussion of the foregoing subject matter, see "The Si-SiO$_2$ Solid-Solid Interface System" by A. G. Revesz and K. H. Zaininger, RCA Review, March, 1968.

As mentioned above, various annealing procedures have been utilized to reduce $Q_{SS}$, with the favorable results of reducing the surface component of junction leakage currents, reducing 1/f noise, and improving junction reverse breakdown characteristics. Unfortunately, the field inversion threshold is also lowered by such annealing steps, making the device more susceptible to the above-described parasitic channels. It is frequently necessary to have the magnitude of the field inversion voltage as high as possible, to prevent the parasitic channels from being turned on. Various techniques have been used in the past to avoid the problems which result from low magnitude field inversion voltages. Such steps have included use of heavily doped "channel stop" diffused regions which "interrupt" the parasitic channels and prevent current flow through them. This approach is very expensive because it may involve an extra processing step (for MOS processes), causing additional damage to the semiconductor surface because of the additional diffusion process required, and greatly reduces the component density of the semiconductor wafer because of the amount of silicon surface area required by the "channel stops". Thicker field oxides have also been utilized to increase the magnitude of field inversion voltage. It is desirable that the field oxide be as thick as possible from the view point of providing high magnitude field inversion voltage. However, thick field oxides are undesirable from many other points of view. In general, thick field oxides are incompatible with the goal of producing high density, high reliability integrated circuits, because spacings between diffused regions, metal regions, etc., must be greater for thick oxides. Reliability problems are frequently encountered for conductors which must run over steep edges of thick field oxide.

Ion implantation of the field region to increase the semiconductor surface impurity concentration is another technique which has been utilized to increase the field inversion voltage. However, this technique is very expensive, as it required expensive ion implantation equipment, and it is incompatible with certain bipolar processing techniques.

In short, the known techniques for improving electrical parameters in integrated circuits such as 1/f noise, reverse junction leakage current, reverse breakdown voltage, etc., have had the undesirable effect of also reducing the field inversion voltage. The known techniques for increasing the field inversion voltage without detrimentally effecting the 1/f noise, the leakage current, etc., have been unwieldy and expensive, reducing the component density on the semiconductor circuit, increasing its cost by requiring the addition of expensive additional processing steps.

SUMMARY OF THE INVENTION

Accordingly, it is an object of the invention to provide a method of making semiconductor devices having reduced PN junction reverse leakage current and an increased field inversion voltage.

It is another object of the invention to provide a method of making semiconductor devices having reduced electrical noise and increased field inversion voltage.

It is yet another object of the invention to provide a method of making a semiconductor devices having reduced surface state charge density and increased oxide charge density.

It is another object of the invention to provide a method of conveniently varying the field inversion voltage of a semiconductor process.

Briefly described, the invention is a method of making a semiconductor device having both low surface state charge density and high oxide charge density. The inventive process is initiated upon a semiconductor which is being subjected to its final high temperature oxidation step. The flow of the oxidizing ambient is stopped, and an inert ambient is caused to flow past the wafer. The temperature of the semiconductor device is gradually reduced to approximately 860 degrees Centigrade and is maintained at that temperature for approximately thirty minutes to allow the oxide-semiconductor interface system to assume a minimum energy configuration, thereby reducing the surface state charge. An oxidyzing ambient is then introduced into the furnace for a short time, for example five minutes, to increase the oxide charge. The flow of the oxidizing ambient is stopped, and the temperature of the semiconductor wafer is reduced to approximately 680 degrees Centigrade. The semiconductor wafer is then removed from the furnace and placed into a furnace at 450 degrees Centigrade. A hydrogen ambient, preferably forming gas, is caused to flow past the semiconductor wafer for approximately thirty minutes to further reduce the surface state charge density without substantially reducing the oxide charge density. The semiconductor wafer is then removed, and the process is complete.

DESCRIPTION OF THE INVENTION

The invention provides a method of decreasing the oxide-silicon interface charge $Q_{SS}$, thereby reducing the surface component of junction reverse leakage current and reducing the 1/f noise of the silicon device, and increasing the oxide charge density $\rho_x$ in order to obtain a high field inversion voltage in the completed device. This result is achieved by a process which includes slow cooling of the silicon wafer from its final high temperature oxidation step. The slow cooling is accomplished in an inert ambient to stabilize the oxide-silicon interface region. The wafer is then subjected to a short oxidation cycle at an intermediate temperature to build up the oxide charge density $\rho_x$. A low temperature hydrogen annealing step is then applied to reduce the density of interface state charge $Q_{SS}$ without substantially decreasing the oxide charge.

Figure 3A:
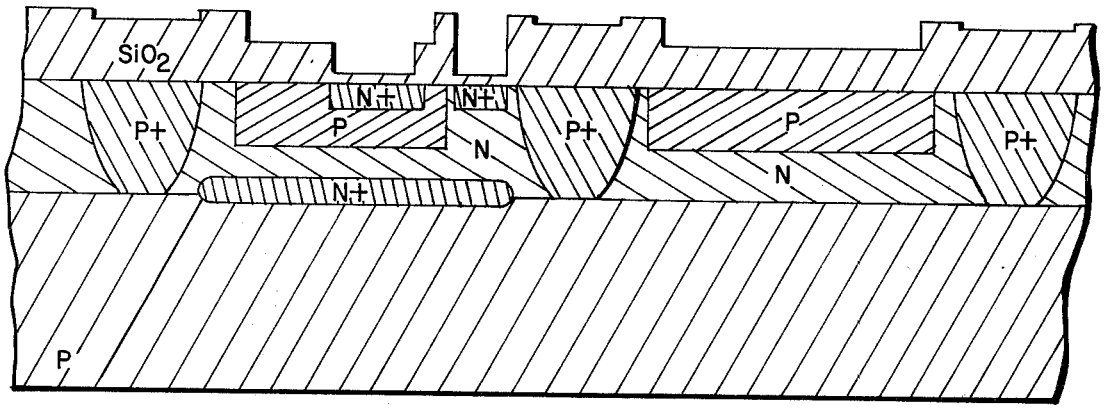
FIG. 3A shows cross-sectional view of a semiconductor wafer at the beginning of the process of FIG. 1.

A semiconductor device ordinarily is subjected to a number of high temperature oxidation operations during its fabrication. The high temperature oxidation processes greatly affect the density of the fixed surface-state charge $Q_{SS}$. The bipolar integrated circuit cross-section shown in FIG. 3A illustrates the configuration of a typical bipolar integrated circuit device at the completion of its final high temperature operation, which is the so-called "emitter diffusion" step. The device has an $SiO_2$ "field oxide" 30 overlying the surface of the silicon body 12. As explained subsequently, the density of the surface states $Q_{SS}$ at the interface between the silicon body and the field oxide greatly affects electrical characteristics of the completed silicon device. Also, the oxide charge density $\rho_x$ in the field oxide affects the field inversion voltage, as subsequently explained.

Figure 3B:
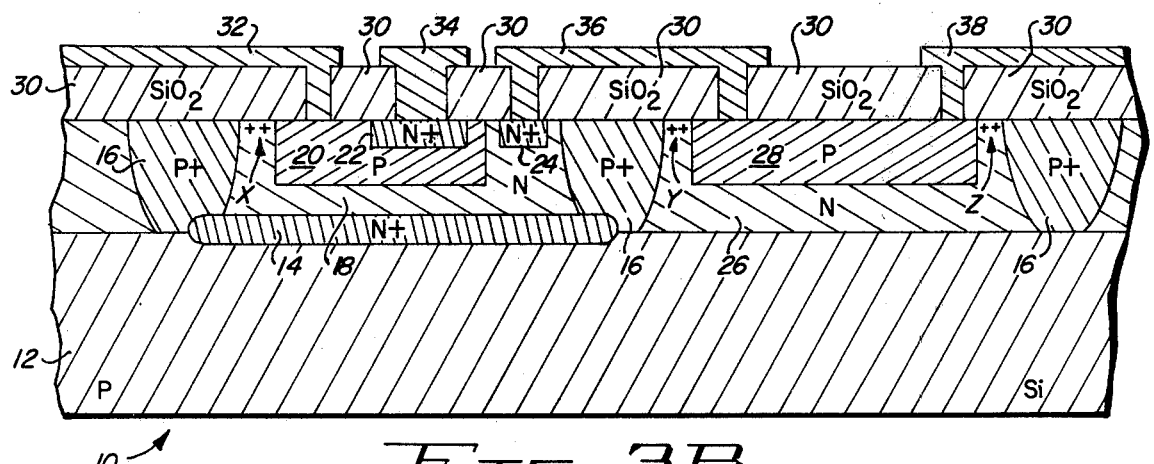
FIG. 3B shows a cross-sectional view of a completed semiconductor wafer and indicates the location of parasitic channels.

FIG. 3B illustrates the silicon device of FIG. 3A after completion of additional etching and metalization steps which are not part of the present process. However, FIG. 3B is useful for explaining the effect of the above-mentioned field inversion voltage. FIG. 3B shows a typical bipolar integrated circuit structure including a P-type silicon region, an epitaxial N-type layer including regions 18 and 26 isolated by P+ isolation regions 16. N region 18 is the collector region of an NPN transistor having a P-type base region 20, an N+ emitter region 22, and a collector contact region 24. P-type region 28 is a diffused resistor. $SiO_2$ layer 30 is the field oxide. Metal regions 32, 34, 36, and 38 provide electrical contact to the base, emitter, and collector of the transistor and to the diffused resistor. The N-type epitaxial regions 18 and 26 are highly doped, so negative voltages whose magnitude exceeds the field inversion voltage applied to the overlying metal regions may cause P-type channels to be formed as indicated by X, Y, and Z. These channels cause leakage currents which may degrade circuit performance.

The emitter diffusion is performed at 1025° C. It is assumed that an oxidizing ambient is present during the emitter diffusion step, which is the "final high temperature" referred to in step 1 of the flow chart of FIG. 1. Referring to FIG. 2, which is a graph of furnace temperature vs. time for process steps 1 through 7 of FIG. 1, the final high temperature process step, i.e., the emitter diffusion step, is represented by line segment 20, between points A and B. At this point the source of the oxidizing agent is turned off, and nitrogen is caused to flow into the furnace, as indicated in Step 2 of FIG. 1, for an amount of time represented by line segment 21 between points B and C in FIG. 2.

The flow rates of the oxidizing agent and the inert ambient were established at 1.5 liters per minute for experiments which were performed in an open tube diffusion system including a seventy-five millimeter diffusion tube with an end cap outlet approximately ¼ of an inch in diameter. The flow rates are selected to prevent back-streaming of the outside atmosphere into the tube. The amount of time represented by line segment 21 in FIG. 2 is approximately five minutes, which is sufficient to purge the diffusion tube of the oxidizing agent.

In Step 3 of the furnace temperature is gradually "ramped" down from 1025° C. to an intermediate temperature of approximately 860°, as shown in FIG. 2 by line segment 22 between points C and D. As explained later, this step reduces the surface state density at the Si-$SiO_2$ interface. The amount of time that elapses between points C and D is approximately sixty to seventy minutes, as indicated by Block 3 in FIG. 1.

Figure 1:
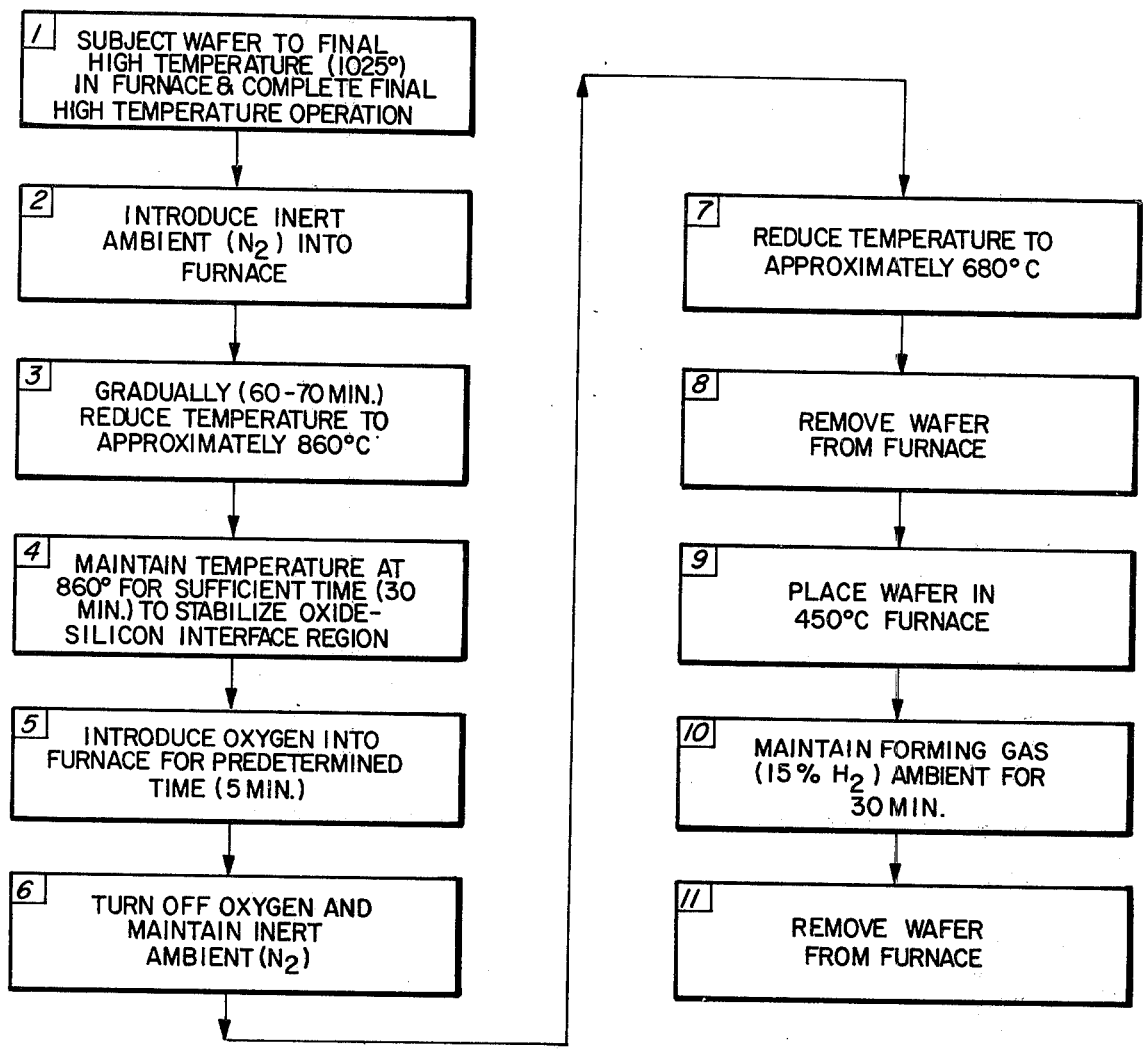
FIG. 1 is a flow chart of a process of one embodiment of the invention.
Figure 2:
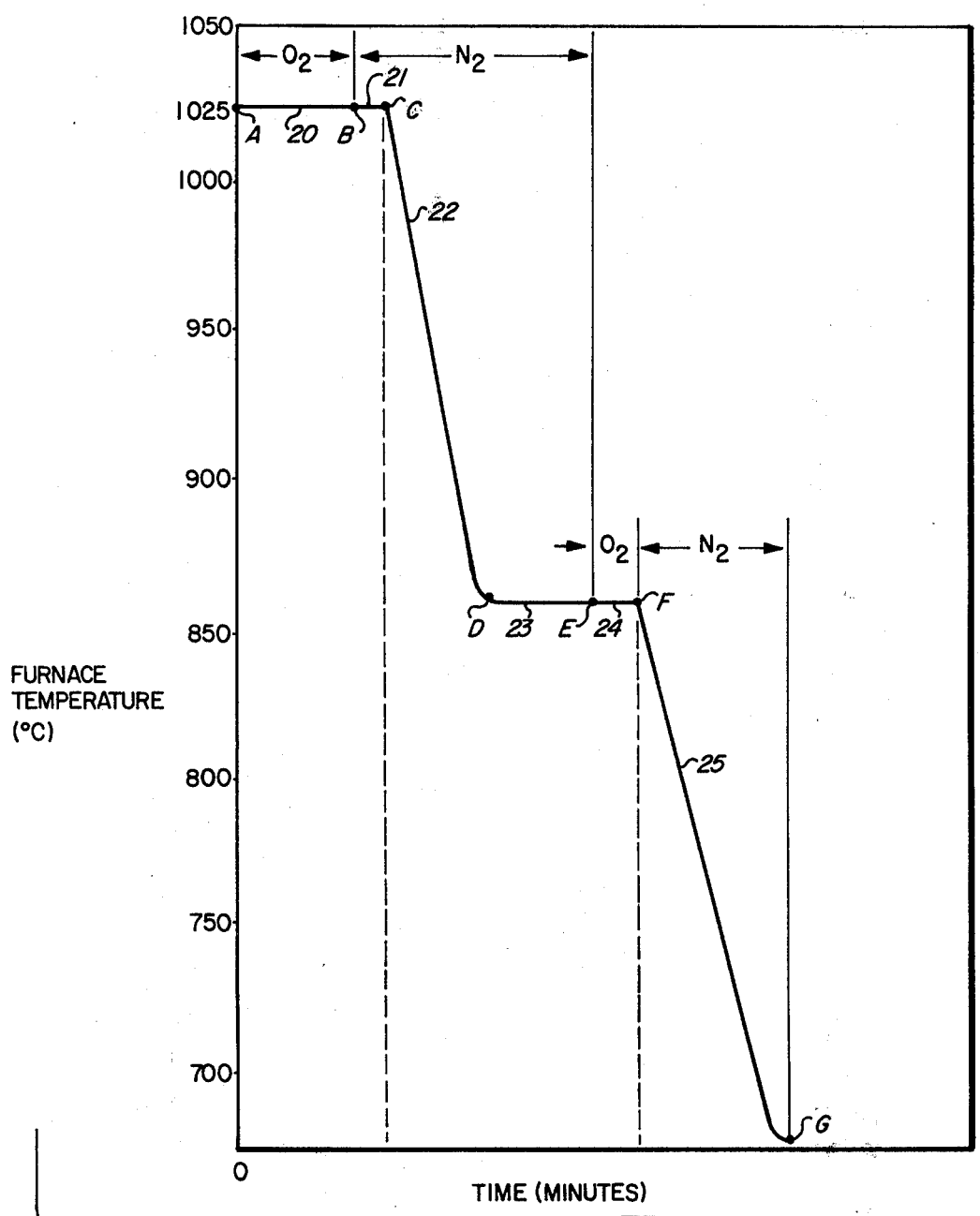
FIG. 2 is a graph of furnace temperature versus time for the process of FIG. 1.

As shown in Step 4 of FIG. 1, the temperature in the furnace in which the silicon wafer is positioned is maintained at approximately 860° for approximately thirty minutes. See line segment 23 between points D and E in FIG. 2.

Step 5 of FIG. 1, a crucial step in the invention, is to introduce oxygen into the furnace for a predetermined time. This step is represented in FIG. 2 by line segment 24, between points E and F. This step re-initiates the thermal oxidation process at the Si-SiO$_2$ interface. However, since the temperature of 860° C. is much lower than it was in the earlier "emitter diffusion" step, the oxidation rate of the Si-SiO$_2$ interface is much lower than it was in the emitter diffusion step. It is well known that the generation of surface-state charges is a strong function of oxidation rate at the time the oxidation process terminates. Therefore, the oxidation which occurs during the time indicated by line segment 24 in FIG. 2 does not generate nearly as many interface states ($Q_{SS}$) as the earlier emitter oxidation process did.

However, the much lower oxidation rate of step 5 rapidly increases the oxide charge because of the diffusion of oxidizing species through the field oxide to the oxide-silicon interface, where further oxidation must occur. Therefore, at the end of the intermediate temperature oxidation (at point F) there is a large oxide charge $\rho_x$, but the density of surface state charge $Q_{SS}$ is only slightly higher than it was at point E in FIG. 2. (It should be noted, however, that the intermediate oxidation process of Step 5 could just as well be carried out at a temperature different than the 860° temperature of line 23 of FIG. 2).

In Step 6 of FIG. 1 and point F of FIG. 2 the oxygen flow in the furnace is stopped, and nitrogen is permitted to flow through the furnace. In Step 7 of FIG. 1 the temperature is gradually reduced from 860° to approximately 680° over a time period of approximately sixty minutes, as indicated by line segment 25 in FIG. 2. Then the wafer is "pulled from the furnace" in Step 8. (Its temperature then rapidly drops to room temperature). It should be noted that the slow cooling procedure indicated by segment 25 between points F and G of FIG. 2 is not essential. However, that slow cooling procedure reduces the number of surface states which would be introduced by stresses which would be caused by rapidly pulling the wafer from the furnace at point F of FIG. 2.

In Step 9 the wafer is placed in a furnace in which the temperature is maintained at 450° C. (Of course, it is not necessary that a separate furnace by utilized, but in the specific manner in which the invention is presently practiced a separate furnace is utilized).

In Step 10, which is an important step of the invention, the wafer is then annealed for thirty minutes in the 450° furnace in a forming gas ambient. The forming gas includes approximately fifteen percent hydrogen, although this percentage is not critical. Pure hydrogen could be utilized as an ambient, but for safety reasons forming gas is more satisfactory. The purpose of the forming gas annealing or hydrogen annealing step of Step 10 is to reduce the $Q_{SS}$ charge to a minimum value without appreciably reducing the oxide charge. This produces completed devices which have low 1/f noise, low junction leakage current, low junction breakdown voltage, and high field inversion voltage.

It should be noted that the process of the flow chart of FIG. 1 and the graph of FIG. 2 has been performed on devices in which the field oxide 30 is approximately 12,000 Angstroms, and the surface concentration of the N-type epitaxial regions 18 and 26 in FIGS. 3A and 3B is approximately $10^{15}$ atoms per cubic centimeter. Very low junction leakage currents and high field inversion voltages (of the order of sixty volts) have been observed. However, when low temperature oxidizing step represented by line segment 24 in FIG. 2 and by Step 5 in FIG. 1 has been omitted, the field inversion voltage has been observed to be in the range from approximately twenty to twenty-two volts, which is close to the theoretical minimum field inversion voltage for such a device.

After a five minute nitrogen purge to eliminate hydrogen from the furnace, the wafer is removed from the 450° furnace, as indicated by Step 11 in FIG. 1. At this point, the process is complete.

It should be noted that the manner in which the hydrogen annealing of Step 10 in FIG. 2 reduces the number of surface state charge $Q_{SS}$ without substantially reducing the oxide charge represented by $\rho_x$ is not fully understood. However, it is believed that the method as described above produces devices with both low $Q_{SS}$ and high $\rho_x$ for essentially the following reasons. It has been found that the oxide charge, which represents a fixed or permanently ionized positive charge in the field oxide, may be eliminated by annealing at temperatures above 800° C. in a helium ambient. It has also been found that the density of a group of states which are included in the surface state charge may be reduced by a low temperature hydrogen anneal treatment between 300° C. to 500° C. The density of the latter states may also be reduced by high temperature annealing, but this however, would also reduce the density of oxide charge, whereas the low temperature hydrogen anneal mainly reduces the density of states which are included in the $Q_{SS}$ charge.

It should be noted that the reason for maintaining the wafer at a constant temperature of 860° C. along line segment 23 is to permit the oxide-silicon interface region to "stabilize". That is, the purpose is to permit the Si-SiO$_2$ interface system to achieve a minimum energy configuration by permitting the dangling oxygen and silicon bonds at the interface region to be completed. In other words, the oxidation process in the interface region is allowed to be completed. The reason for the slow reduction of furnace temperature along line segment 22 is to avoid damage to the crystal structure of the silicon wafer and to avoid especially stresses which occur at the oxide-silicon interface region when a silicon wafer having an oxide thereon is subjected to a sudden decrease in temperature. The differences in coefficients of thermal expansion between the oxide and the silicon crystal causes a great increase in the number of surface-state imperfections in the silicon. Further, slip lines may occur in the crystal structure which create additonal traps and recombination centers which deleteriously affect reverse leakage current and noise performance of the semiconductor device.

Many alternatives to the process details as set forth above are possible. For example, the initial high temperature may be substantially either higher or lower than 1025° C., depending on what type of device is being fabricated and what earlier processing techniques have been utilized in its fabrication. This slope of line 22 during the first slow cool process may be greater or less than shown in FIG. 2. However, the steeper the slope, the more crystal damage will occur to the silicon. The 860° temperature maintained between points D and E may be somewhat higher than 860°, and may be substantially lower. For example, the temperature between points D and E of FIG. 2 may be in the range from 600° C. to 950° C. The intermediate oxidation temperature between points E and F may be higher, but $Q_{SS}$ will also be higher because of the increased rate of oxidation. The intermediate oxidation may also occur at a considerable lower temperature, for example, 680° C.

The intermediate stabilization temperature of Step 3 in FIG. 1, also indicated by line segment 23 in FIG. 2, may be varied. The value of 860° was initially selected because it is a temperature from which the wafer can be rapidly quenched to room temperatures without significant further effect on the interface system. Any temperature lower than 860° would also be suitable, but would take more time. The upper limit has not been precisely determined. The selection of the intermediate temperature essentially involves the trade off between the amount of $Q_{SS}$ charge which is acceptable in the wafer and the amount of time available to perform the process. However, once the temperature has been reduced to the range of 650° to 700° C., "a quench" to room temperatures will have no further affect on and will cause no more deformation of the silicon lattice structure surface state generation at the oxide-silicon interface. (Although thermal stresses will indeed occur within the silicon crystal structure, during rapid cooling from temperatures no damage to the crystal structure results from such stresses.)

The oxidation time for Step 5 of FIG. 1 may be varied. For example, it was found that if the time of oxidation at 860°, along line 24, is continued for thirty minutes, the field inversion will be in the range from forty to forty-five volts. Thus, the field inversion voltage may be readily altered in the method of the present invention by merely varying the time of the intermediate temperature oxidation step (Step 5 in FIG. 1).

It is believed that Step 10 in FIG. 1 may be performed in a Helium ambient, rather than a hydrogen ambient, with comparable results.

In summary, various high temperature slow-cooling and annealing processes have been utilized to reduce the density of surface-state charge centers in the oxide-silicon interface system. However, such processes have in the past also reduced the oxide charge, resulting in low field inversion voltages.

The process according to the invention has provided two important additional steps to the known annealing and slow-cooling processes. First, a low temperature oxidation of the semiconductor wafer has been provided after an initial stabilizing slow-cooling and an annealing procedure has been performed on the wafer in order to build up the amount of oxide charge. Second, a low temperature hydrogen annealing of the semiconductor wafer has been provided to eliminate as many more of the low energy surface states as possible without further affecting the oxide charge. As a result, the completed semiconductor device has previously unachieved combination of high field inversion voltage, low junction leakage current, high junction reverse breakdown voltages, and low noise in a device with relatively thin field oxide and conventional, low cost processing.

The above process avoids the disadvantages of the above prior techniques of increasing field inversion voltage. Thinner field oxides can be utilized. The invention obviates the necessity of subjecting the wafer to the expensive process of implanting ions in the surface to raise the field inversion voltage. Use of thinner field oxides eliminates the problems associated with conductors maintaining good continuity over steep oxide slopes. Further smaller preohmic contacts may be utilized, and denser packing of circuitry may be achieved when thinner field oxides are utilized. The above process avoids the use of deposited doped field oxides to raise field inversion voltage may create a host of additional processing problems which are completely avoided by the process of the invention. And finally, the invention avoids the need for channel stop diffusions, thereby permitting greater density of semiconductor components in a given amount of silicon area, especially for high voltage circuits.

We claim:

1. A method for making a semiconductor device having an increased field inversion threshold voltage and also have improved electrical parameters including reduced PN junction reverse leakage current and reduced electrical noise, wherein said semiconductor device has been subjected to at least one high temperature step including forming an oxide on a layer of semiconductor, said method comprising the further steps of:
   (a) causing an inert gas to flow past said semiconductor device;
   (b) ramping the temperature of said semiconductor device from the temperature of said high temperature step to a temperature in the range from 600 to 950 degrees Centigrade;
   (c) maintaining said semiconductor device at said temperature in the range from 600 to 950 degrees Centigrade;
   (d) causing an oxidizing gas to flow past said semiconductor device;
   (e) causing said oxidizing gas to stop flowing past said semiconductor device;
   (f) reducing the temperature of said semiconductor device;
   (g) causing hydrogen to flow past said semiconductor device;
   (h) maintaining said semiconductor device at a temperature in the range from 300 to 500 degrees Centigrade; and
   (i) stopping the flow of said hydrogen.

2. The method of claim 1 wherein said temperature in the range from 600 to 950 degrees Centigrade is approximately 860 degrees Centigrade.

3. The method of claim 1 wherein said inert gas of step (a) is nitrogen.

4. The method of claim 1 wherein said high temperature step occurs at approximately 1025 degrees Centigrade.

5. The method of claim 1 wherein the temperature of step (h) is approximately 450 degrees Centigrade.

6. The method of claim 1 wherein said oxidizing gas of step (d) is caused to flow for a time less than thirty minutes.

7. The method of claim 6 wherein the duration and the temperature of step (d) are selected to raise the field inversion voltage of said semiconductor device to a predetermined level.

8. The method of claim 1 wherein the oxidizing gas of step (d) is caused to flow for approximately five minutes.

9. The method of claim 1 wherein the semiconductor material of said semiconductor device is silicon and the oxide layer is silicon dioxide.

10. The method of claim 9 wherein the temperature in step (h) is maintained for a time selected to reduce the surface-state charge at the interface between the oxide and silicon to a predetermined level.

11. The method of claim 1 wherein said ramping is performed over a time period of approximately sixty minutes.

12. The method of claim 1 wherein the temperature reducing of step (f) is performed at a rate selected to prevent oxygen in the oxide from further diffusion to the oxide-semiconductor interface.

13. The method of claim 1 wherein the order of steps (f) and (g) is reversed.

14. The method of claim 1 wherein the duration of said ramping is selected to anneal out surface states induced by differences in thermal expansion coefficients of the oxide layer and the semiconductor material of said semiconductor device.

15. The method of claim 1 wherein the hydrogen of step (g) is in forming gas which is caused to flow past said semiconductor device.

16. The method of claim 1 wherein step (f) includes ramping the temperature from said temperature in the range from 600 to 900 degrees Centigrade to approximately 680 degrees Centigrade, to reduce cooling stresses in said semiconductor device.

17. A method for making a semiconductor device having an increased field inversion threshold voltage and also have improved electrical parameters including reduced PN junction reverse leakage current and reduced electrical noise, wherein said semiconductor device has been subjected to at least one high temperature step including forming an oxide on a layer of semiconductor, said method comprising the further steps of:
   (a) causing an inert gas to flow past said semiconductor;
   (b) ramping the temperature of said semiconductor device from the temperature of said high temperature step to a temperature in the range from 600 to 950 degrees Centigrade;
   (c) maintaining said semiconductor device at said temperature in the range from 600 to 950 degrees Centigrade;
   (d) causing an oxidizing gas to flow past said semiconductor device;
   (e) causing said oxidizing gas to stop flowing past said semiconductor device;
   (f) reducing the temperature of said semiconductor device;
   (g) causing helium to flow past said semiconductor
   (h) maintaining said semiconductor device at a temperature in the range from 300 to 500 degrees Centigrade; and
   (i) stopping the flow of said helium.

* * * * *